(12) United States Patent
Oh et al.

(10) Patent No.: US 7,586,339 B2
(45) Date of Patent: Sep. 8, 2009

(54) OUTPUT CIRCUIT AND METHOD THEREOF

(75) Inventors: Chi-Sung Oh, Suwon-si (KR); Hyo-Joo Ahn, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 47 days.

(21) Appl. No.: 11/430,899

(22) Filed: May 10, 2006

(65) Prior Publication Data
US 2007/0008787 A1 Jan. 11, 2007

(30) Foreign Application Priority Data
Jul. 11, 2005 (KR) .................... 10-2005-0062402

(51) Int. Cl.
H03K 17/04 (2006.01)
(52) U.S. Cl. .................... 327/108; 327/112; 326/82
(58) Field of Classification Search ............. 327/108, 327/112; 326/82
See application file for complete search history.

(56) References Cited

U.S. PATENT DOCUMENTS

| | | | | |
|---|---|---|---|---|
| 5,535,171 A | * | 7/1996 | Kim et al. | 365/233.14 |
| 5,777,497 A | * | 7/1998 | Han | 327/108 |
| 5,798,969 A | * | 8/1998 | Yoo et al. | 365/189.05 |
| 6,215,726 B1 | * | 4/2001 | Kubo | 365/233 |
| 6,636,445 B2 | * | 10/2003 | Ohshima et al. | 365/190 |
| 6,744,298 B2 | * | 6/2004 | Yamauchi et al. | 327/333 |
| 6,822,490 B2 | * | 11/2004 | Hyun et al. | 327/108 |
| 6,940,321 B2 | * | 9/2005 | Heo et al. | 327/112 |
| 7,038,972 B2 | * | 5/2006 | Seo et al. | 365/233 |
| 7,230,466 B2 | * | 6/2007 | Park | 327/176 |

FOREIGN PATENT DOCUMENTS

| | | |
|---|---|---|
| KR | 2003-85842 | 11/2003 |
| KR | 1020030097441 A | 12/2003 |
| KR | 2004-23300 | 3/2004 |

* cited by examiner

Primary Examiner—An T Luu
(74) Attorney, Agent, or Firm—Harness, Dickey & Pierce, PLC (57) ABSTRACT

An output circuit and method thereof. In an example, the output circuit may include an output buffer configured to buffer output data and to transfer the buffered output data to an output node, the output buffer initializing the output node in response to a triggering signal. In another example, the method may include buffering output data in response to an output buffer enabling signal, transferring the buffered output data to an output node and initializing the output node of an output buffer in response to a triggering signal.

29 Claims, 10 Drawing Sheets

OUTPUT CIRCUIT AND METHOD THEREOF

PRIORITY STATEMENT

This application claims the benefit under 35 U.S.C. § 119 (a) of Korean Patent Application No. 2005-62402 filed on Jul. 11, 2005, the contents of which are herein incorporated by reference in its entirety.

BACKGROUND OF THE INVENTION

1. Field of the Invention

Example embodiments of the present invention relate generally to a semiconductor device and method thereof, and more particularly to an output circuit and method thereof.

2. Description of the Related Art

A conventional semiconductor memory device may output stored data from and/or store new data into a memory cell array. Conventional semiconductor memory devices may have different operation modes for performing reset functions, including a hard reset and a soft reset mode. In the hard reset mode, the semiconductor memory device may be turned off completely and then turned on again. In the soft reset mode, a number of internal circuits may be turned off temporarily without a complete shutdown of the semiconductor memory device. During a soft reset, a portion of the internal circuits of the semiconductor memory device may continue to operate.

If the semiconductor memory device performs a read operation concurrently with a soft reset, an output circuit of the semiconductor memory device may retain data (e.g., data to be reset by the soft reset) after the soft reset. If the semiconductor memory device attempts to perform a write operation under an abnormal condition (e.g., during a soft reset), differences may occur between externally provided data for the write operation and the data obtained via a read operation.

SUMMARY OF THE INVENTION

An example embodiment of the present invention is directed to an output circuit, including an output buffer configured to buffer output data and to transfer the buffered output data to an output node, the output buffer initializing the output node in response to a triggering signal.

Another example embodiment of the present invention is directed to a method of outputting data from an output circuit, including buffering output data in response to an output buffer enabling signal, transferring the buffered output data to an output node and initializing the output node of an output buffer in response to a triggering signal.

Example embodiments of the present invention are directed to e an output circuit of a semiconductor memory device that initializes output data therein under an abnormal condition.

Another example embodiment of the present invention pare directed to a method of initializing an output circuit of a semiconductor memory device under the abnormal condition.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Example embodiments of the present invention are described more fully hereinafter with reference to the accompanying drawings, in which example embodiments of the present invention are shown. This invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
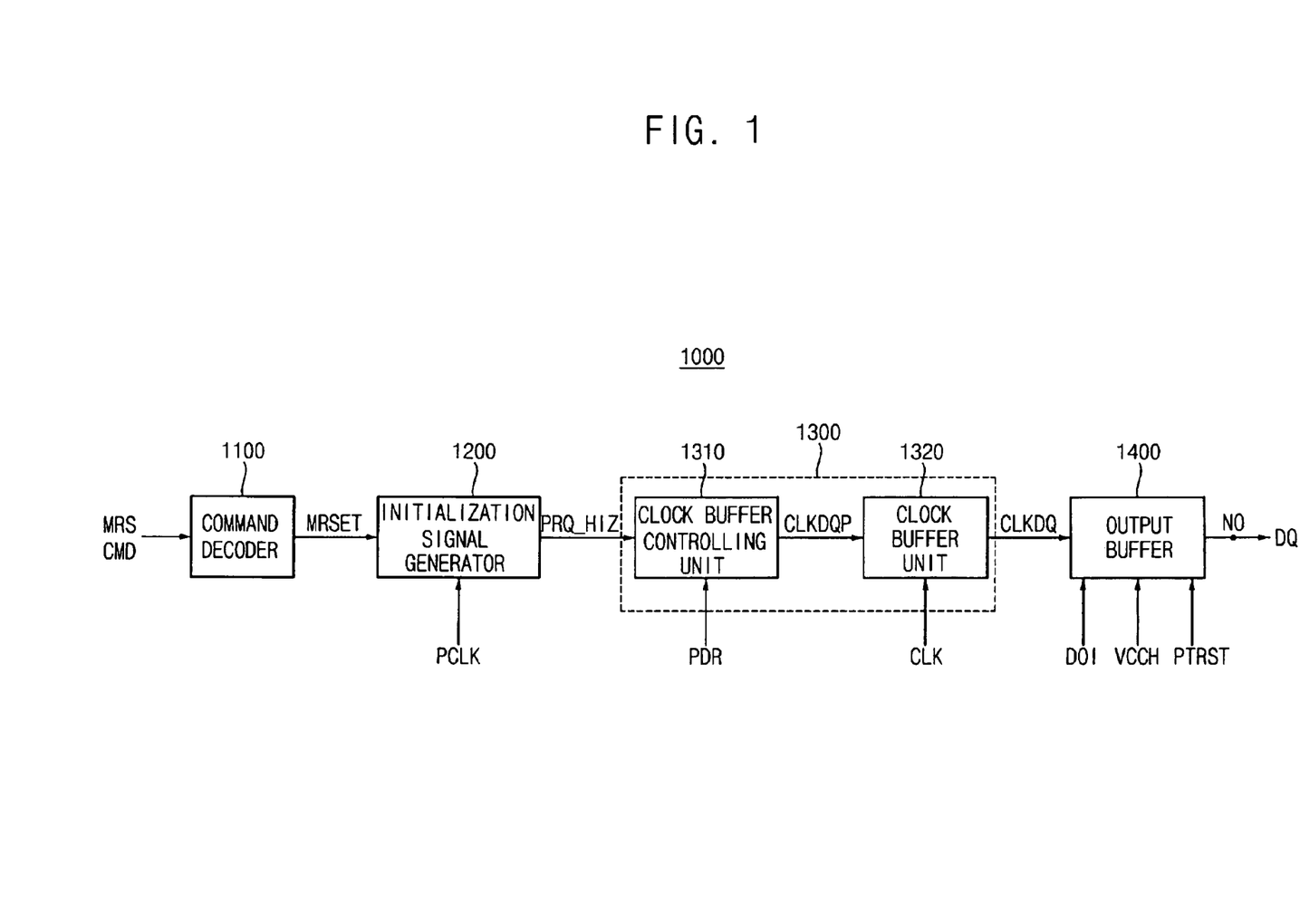
FIG. 1 is a block diagram illustrating an output circuit according to an example embodiment of the present invention.

FIG. 1 is a block diagram illustrating an output circuit 1000 according to an example embodiment of the present invention. In an example, the output circuit 1000 may be included within a semiconductor memory device.

In the example embodiment of FIG. 1, the output circuit 1000 may include an initialization signal generator 1200, a clock buffer 1300 and an output buffer 1400. The initialization signal generator 1200 may generate an initialization signal PRQ_HIZ in response to an internal clock PCLK and a mode register set (MRS) signal MRSET. The clock buffer 1300 may generate an output clock signal CLKDQ in response to a read signal PDR, the initialization signal PRQ_HIZ and a clock signal CLK. The output buffer 1400 may buffer an output data DOI to provide the output data DOI to an output node NO, in response to the output clock signal CLKDQ and an output buffer enabling signal PTRST. Additionally, the output buffer 1400 may initialize the output node NO in response to the output clock signal CLKDQ and a power-up signal VCCH.

In the example embodiment of FIG. 1, the output circuit 1000 may further include a command decoder 1100 that may generate the MRS signal MRSET in response to a mode set register command MRS CMD. The MRS signal command MRS CMD may include a chip select signal, a row address strobe signal, a column address strobe signal and/or a write enable signal, etc.

In the example embodiment of FIG. 1, the clock buffer 1300 may include a clock buffer controlling unit 1310 and a clock buffering unit 1320. The clock buffer controlling unit 1310 may generate a clock buffer enabling signal CLKDQP in response to the read signal PDR and the initialization signal PRQ_HIZ. The clock buffering unit 1330 may generate the output clock signal CLKDQ in response to the clock buffer enabling signal CLKDQP and the clock signal CLK.

Example operation of the output circuit 1000 of FIG. 1 will now be described in greater detail.

In example operation of the output circuit 1000 of FIG. 1, if an abnormal condition (e.g., a soft reset, a hard reset, etc.) occurs, the output circuit 1000 may initialize the output data DQ to set the output node NO to a higher impedance state (e.g., alternatively referred to as "high-Z").

In example operation of the output circuit 1000 of FIG. 1, the initialization signal generator 1200 may activate the initialization signal PRQ_HIZ in response to the MRS signal MRSET during an abnormal condition. The clock buffer 1300 may activate the output clock signal CLKDQ in response to the initialization signal PRQ_HIZ. The output buffer 1400 may initialize the output node NO in response to the output clock signal CLKDQ such that the output node NO may transition to the higher impedance state.

Figure 2:
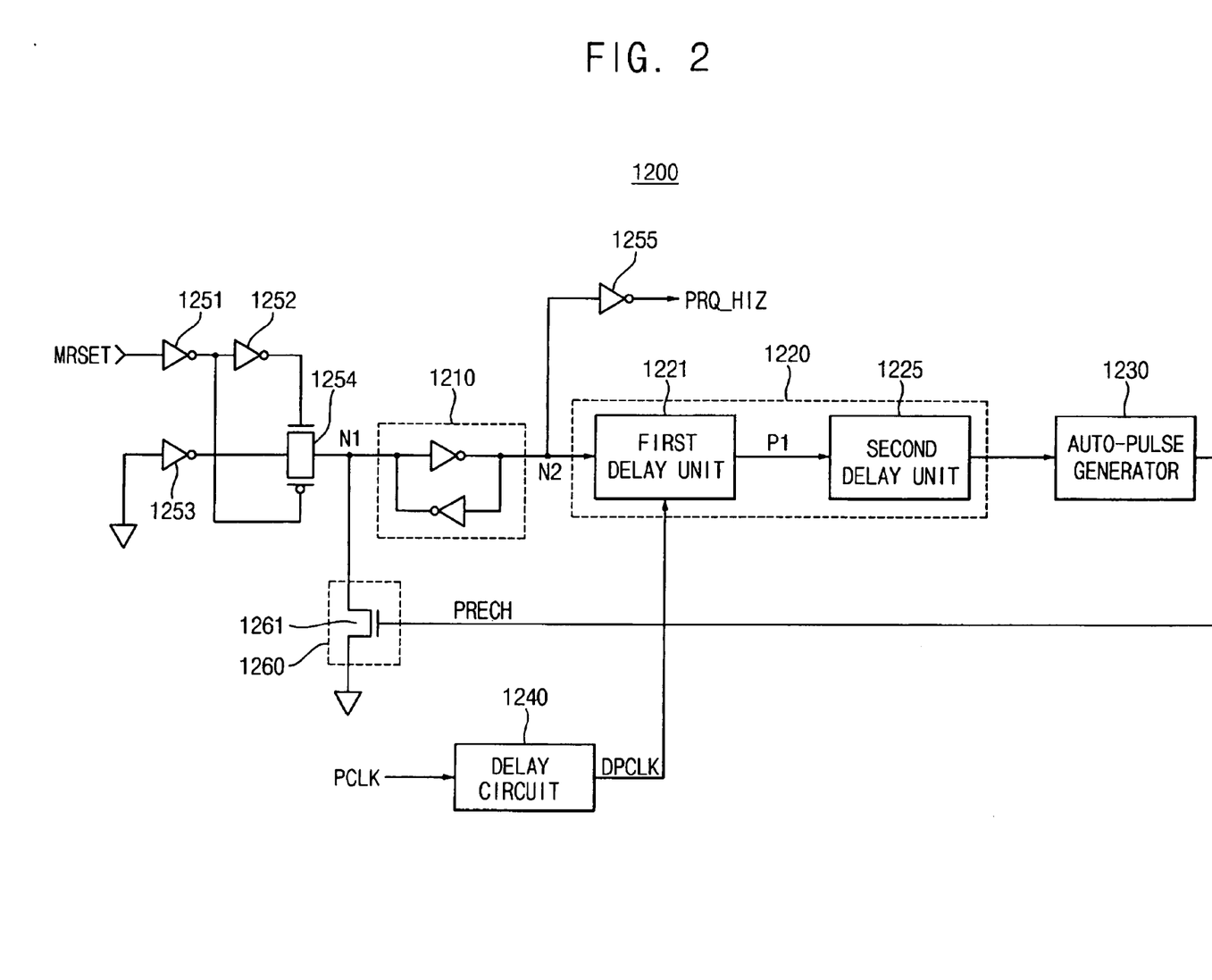
FIG. 2 is a circuit diagram illustrating the initialization signal generator within the output circuit of FIG. 1 according to another example embodiment of the present invention.

FIG. 2 is a circuit diagram illustrating the initialization signal generator 1200 within the output circuit 1000 of FIG. 1 according to another example embodiment of the present invention.

In the example embodiment of FIG. 2, the initialization signal generator 1200 may include a latch 1210, an auto-pulse generator 1230, delay circuits 1220 and 1240, an inverter 1253, a transfer gate 1254 and a reset circuit 1260.

In the example embodiment of FIG. 2, the inverter 1253 may invert a ground voltage and may generate a first signal having a first logic level (e.g., a higher logic level or logic "1"). The transfer gate 1254 may transfer the first signal to a first node N1 in response to the MRS signal MRSET. The latch 1210 may latch the first signal at the first node N1 to provide the first signal to a second node N2. The delay circuit 1240 may delay the internal clock signal PCLK for a first delay time to generate a delayed internal clock signal DPCLK. The delay circuit 1220 may delay a signal on the second node N2 for a second delay time (e.g., less than the first delay time) in response to the delayed internal clock signal DPCLK. The auto-pulse generator 1230 may generate a reset control signal PRECH, having a given pulse width, in response to an output of the delay circuit 1220. The reset circuit 1260 may reset the first node N1 in response to the reset control signal PRECH.

In the example embodiment of FIG. 2, the initialization signal generator 1200 may further include an inverter 1255 that may invert a signal at the second node N2 to generate the initialization signal PRQ_HIZ. The initialization signal generator 1200 may further include an inverter 1251 providing a first control terminal of the transfer gate 1254 with an inverted MRS signal MRSET. The initialization signal generator 1200 may further include an inverter 1252 providing a second control terminal of the transfer gate 1254 with an inverted signal of an output of the inverter 1251.

Figure 3:
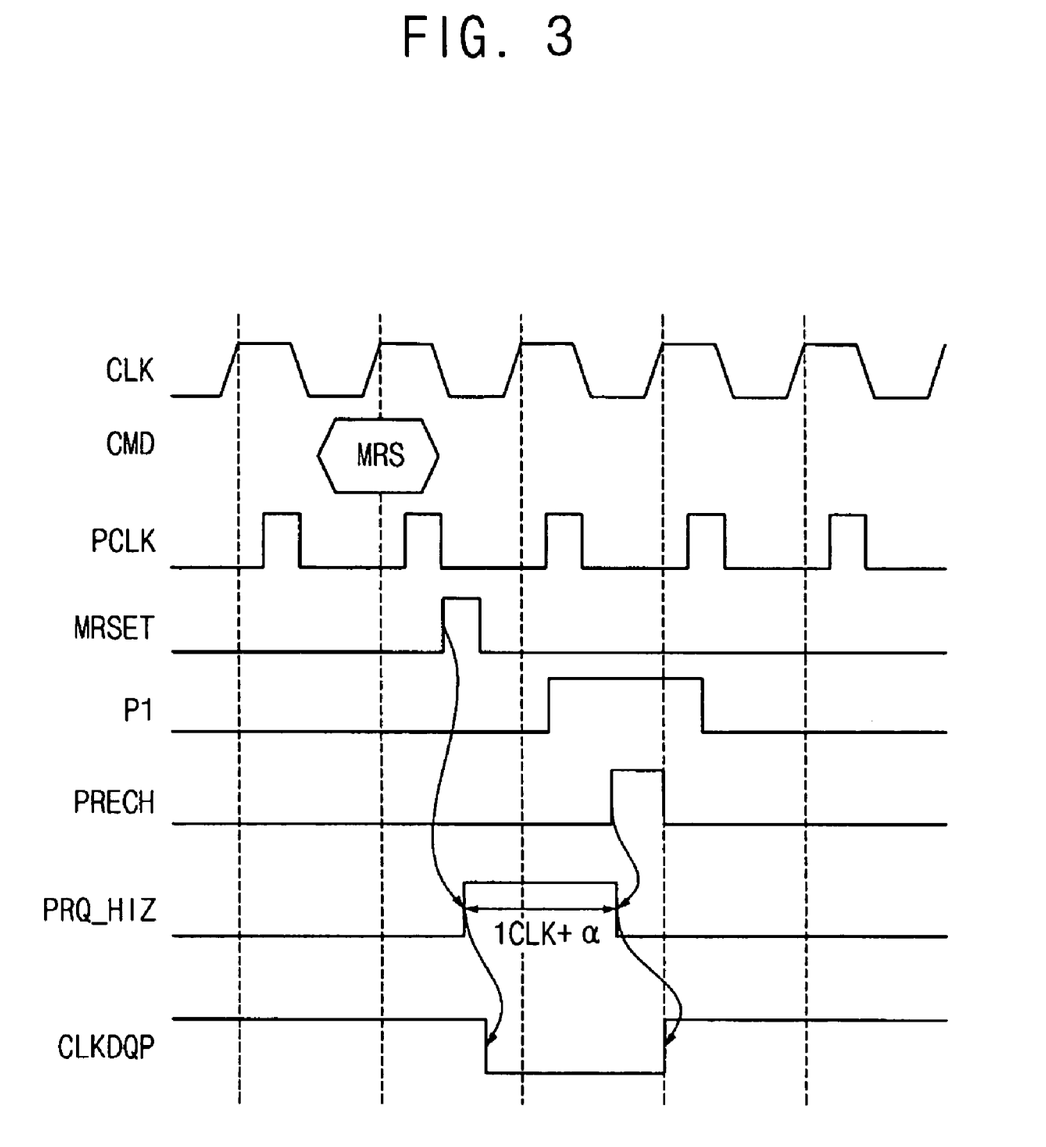
FIG. 3 illustrates a timing diagram for an initialization signal generator according to another example embodiment of the present invention.

FIG. 3 illustrates a timing diagram for the initialization signal generator 1200 of FIG. 2 according to another example embodiment of the present invention. Example operation of the initialization signal generator 1200 of FIG. 2 within the output circuit 1000 of FIG. 1 will now be described in greater detail with reference to the example timing diagram of FIG. 3.

In example operation of the initialization signal generator 1200 of FIG. 2 with reference to the example timing diagram of FIG. 3, if the MRS signal MRSET is activated (e.g., transitioned to the first logic level), the transfer gate 1254 may be turned on, and a signal set to the first logic level (e.g., a higher logic level or logic "1"), which may be generated by inverting a ground voltage with the inverter 1253, may be output from the first node N1. The signal at the first node N1 may be latched and inverted by the latch 1210. The latched, inverted signal may be output by the latch 1210 at a second node N2. The latched, inverted signal at the second node N2 may transition to a second logic level (e.g., a lower logic level or logic "0") and an output signal at an inverter 1255 (e.g., the initialization signal PRQ_HIZ) may transition to the first logic level.

In example operation of the initialization signal generator 1200 of FIG. 2 with reference to the example timing diagram of FIG. 3, the latched, inverted signal at the second node N2 may be delayed by the delay circuit 1220 for a given delay time. The auto-pulse generator 1230 may receive the delayed signal from the delay circuit 1220 and may generate the reset control signal PRECH with a given pulse width. The reset circuit 1260 may reset the first node N1 in response to the reset control signal PRECH. If the reset control signal PRECH is set to the first logic level (e.g., a higher logic level or logic "1"), an NMOS transistor 1261 in the reset circuit 1260 may turn on and the signal on the first node N1 may transition to the second logic level (e.g., a lower logic level or logic "0"). The latched, inverted signal on the second node N2 may thereby transition to the first logic level and the initialization signal PRQ_HIZ output from the inverter 1255 may transition to the second logic level.

In example operation of the initialization signal generator 1200 of FIG. 2 with reference to the example timing diagram of FIG. 3, the initialization signal PRQ_HIZ may be activated (e.g., transitioned to the first logic level) in response to the MRS signal MRSET and may be deactivated (e.g., transitioned to the second logic level) in response to the reset control signal PRECH. A pulse width of the initialization signal PRQ_HIZ may be based, at least in part, on the delay time of the delay circuit 1220. A first delay unit 1221 may delay the signal at the second node N2 for a first delay time (e.g., approximating a period of the internal clock signal PCLK) using the delayed internal clock signal DPCLK. A second delay unit 1225 may delay the signal output from the first delay unit 1221 for a second delay time (e.g., shorter than the period of the internal clock signal PCLK, shorter than the first delay time, etc.) In an example, the delay circuit 1240 may delay the internal clock signal PCLK based on when the MRS signal MRSET arrives at the second node N2.

In example operation of the initialization signal generator 1200 of FIG. 2 with reference to the example timing diagram of FIG. 3, the MRS signal MRSET may be generated in response to the MRS command CMD. The initialization signal PRQ_HIZ may be generated in response to the MRS signal MRSET. The initialization signal PRQ_HIZ may be maintained at the first logic level (e.g., a higher logic level or logic "1") for a total delay period (e.g., 1CLK+β) and may transition to the second logic level (e.g., a lower logic level or logic "0") in response to a first edge (e.g., a rising edge) of the reset control signal PRECH, wherein the first delay period 1CLK may be a time delayed by the first delay unit 1221 in FIG. 2, and the second delay period a may be a time delayed by the second delay unit 1225.

Figure 4:
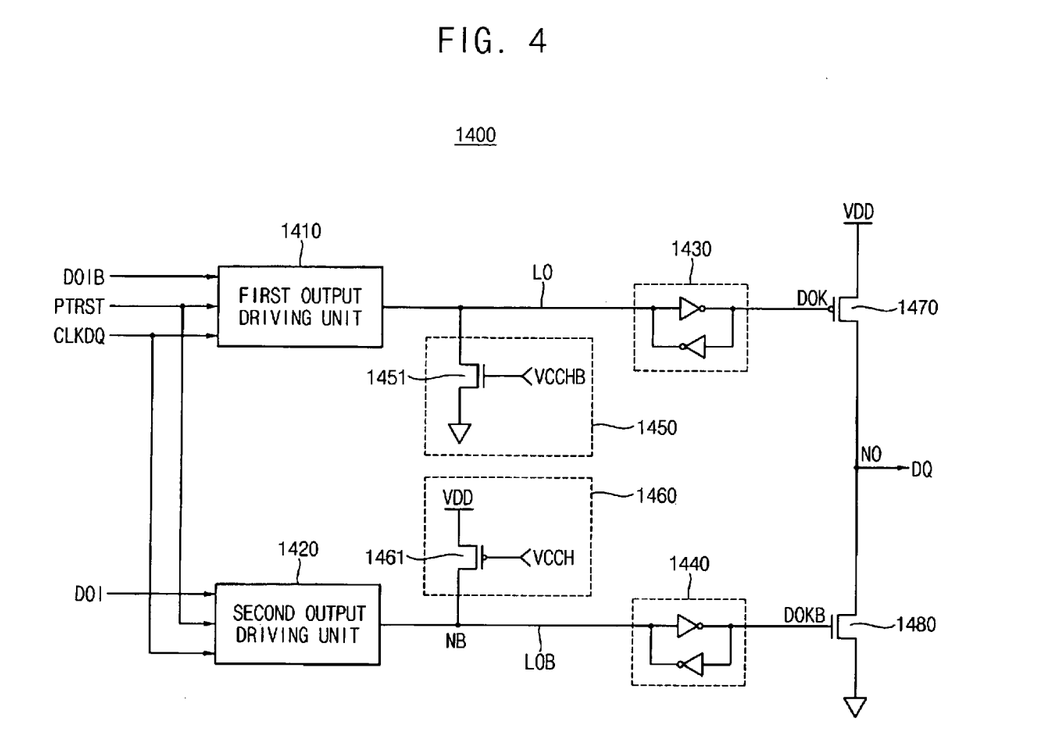
FIG. 4 is a circuit diagram illustrating an output buffer according to another example embodiment of the present invention.

FIG. 4 is a circuit diagram illustrating the output buffer 1400 included within the output circuit 1000 of FIG. 1 according to another example embodiment of the present invention. In the example embodiment of FIG. 4, the output buffer 1400 may include a first output driving unit 1410, a second output driving unit 1420, a first latch 1430, a second latch 1440, a pull-up transistor 1470 and a pull-down transistor 1480.

In the example embodiment of FIG. 4, the first output driving unit 1410 may output an inverted output data DOIB to a first output line LO in response to the output buffer enabling signal PTRST and the output clock signal CLKDQ. The second output driving unit 1420 may output an output data DOI to a second output line LOB in response to the output buffer enabling signal PTRST and the output clock signal CLKDQ. The first latch 1430 may latch a first signal received on the first output line LO, and the second latch 1440 may latch a second signal received on the second output line LOB.

In the example embodiment of FIG. 4, the pull-up transistor 1470 may electrically connect the output node NO to a power supply voltage VDD in response to an output signal DOK of the first latch 1430. The pull-down transistor 1480 may electrically connect the output node NO to a ground voltage VSS in response to an output signal DOKB of the second latch 1440.

In the example embodiment of FIG. 4, the output buffer 1400 may include a first reset circuit 1450 and a second reset circuit 1460. The first reset circuit 1450 may electrically connect the first output line LO to the ground voltage VSS in response to an inverted power-up signal VCCHB. The second reset circuit 1460 may electrically connect the second output line LOB to the power supply voltage VDD in response to the power-up signal VCCH. For example, the first reset circuit 1450 may include an NMOS transistor 1451 that may be connected between the first output line LO and the ground voltage VSS. The first reset circuit 1450 may be activated by the inverted power-up signal VCCHB. In an example, the second reset circuit 1460 may include a PMOS transistor 1461 that may be connected between the second output line LOB and the power supply voltage VDD, and the second reset circuit 1460 may be activated by the power-up signal VCCH.

Example operation of the output buffer 1400 of FIG. 4 will now be described in greater detail.

In example operation of the output buffer 1400 of FIG. 4, the output buffer 1400 may provide the output node NO with the output data DOI as a final output data DQ. During a power-up operation, the first reset circuit 1450 may transition the first output line LO to the second logic level (e.g., a lower logic level or logic "0") and the second reset circuit 1460 may transition the output line LOB to the first logic level (e.g., a higher logic level or logic "1"). A gate of the pull-up transistor 1470 may transition to the first logic level (e.g., a higher logic level or logic "1") (e.g., the output signal DOK), and a gate of the pull-down transistor 1480 may transition to the second logic level (e.g., a lower logic level or logic "0") (e.g., the inverted output signal DOKB). Thus, both the pull-up transistor 1470 and the pull-down transistor 1480 may be turned off and the output node NO may transition to the higher impedance state.

In example operation of the output buffer 1400 of FIG. 4, if a semiconductor memory device including the output circuit of FIG. 1, which further includes the output buffer 1400, executes a write operation after a read operation, the output clock signal CLKDQ may be activated in response to the initialization signal PRQ_HIZ. The output node NO may transition to the higher impedance state so as to be initialized based on the output clock signal CLKDQ if an abnormal condition (e.g., a soft reset, a hard reset, etc.) occurs.

Figure 5:
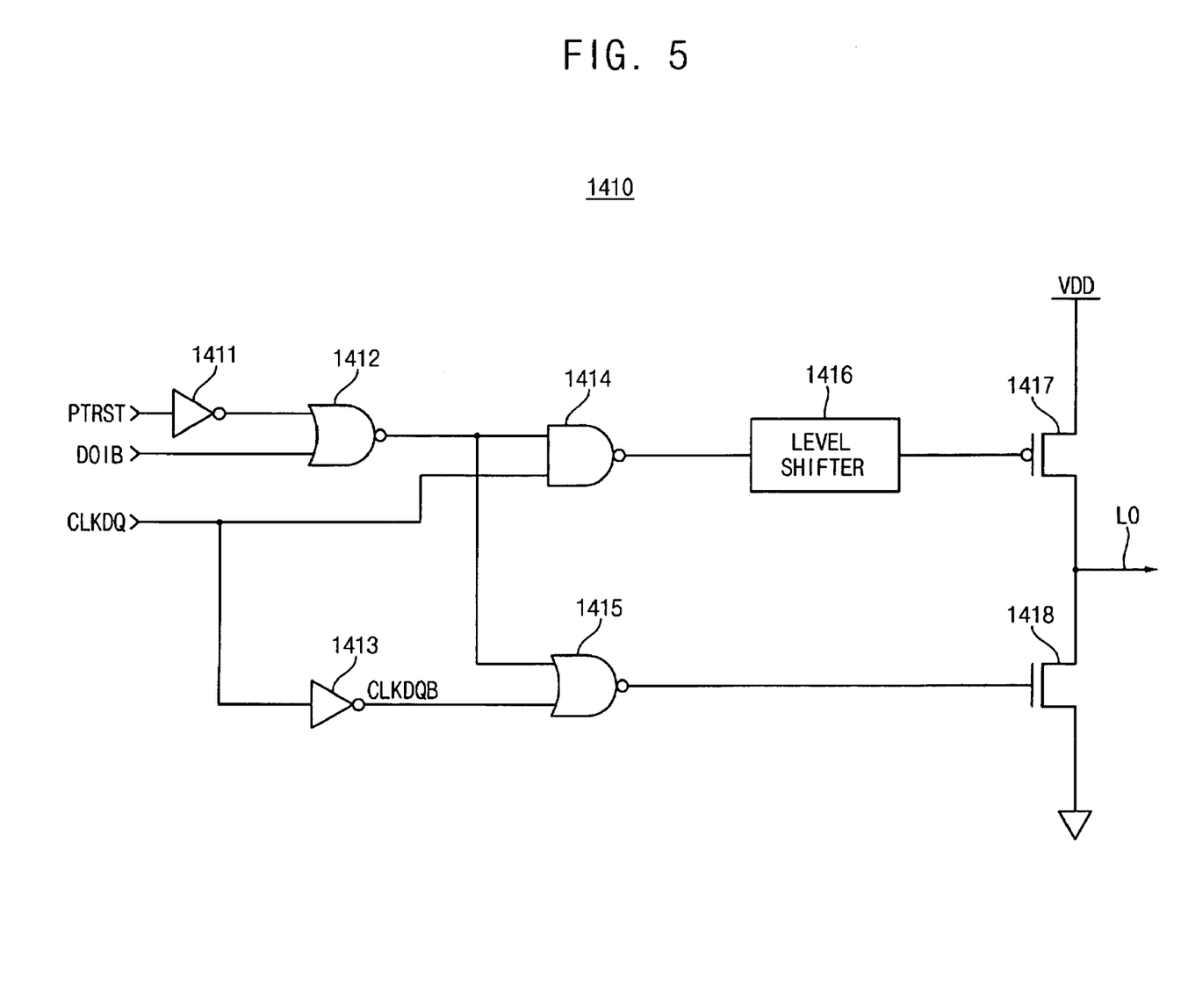
FIG. 5 is a circuit diagram illustrating a first output driving unit according to another example embodiment of the present invention.

FIG. 5 is a circuit diagram illustrating the first output driving unit 1410 of the output buffer 1400 of FIG. 4 according to another example embodiment of the present invention. In the example embodiment of FIG. 5, the first output driving unit 1410 may include inverters 1411 and 1413, NOR gates 1412 and 1415, a NAND gate 1414, a level shifter 1416, a pull-up transistor 1417 and a pull-down transistor 1418.

In the example embodiment of FIG. 5, the inverter 1411 may invert the output buffer enabling signal PTRST and the inverter 1413 may invert the output clock signal CLKDQ. The NOR gate 1412 may execute a negative disjunction (NOR) operation on an output signal of the inverter 1411 and the inverted output data DOIB. The NAND gate 1414 may execute a negative conjunction (NAND) operation on an output signal of the NOR gate 1412 and the output clock signal CLKDQ. The NOR gate 1415 may execute a NOR operation on an output signal of the inverter 1413 and the output of the NOR gate 1412. The level shifter 1417 may shift or adjust a voltage level of an output signal of the NAND gate 1414. The pull-up transistor 1418 may electrically connect the first output line LO to the power supply voltage VDD in response to an output of the level shifter 1416, and the pull-down transistor 1418 may electrically connect the first output line LO to the ground voltage VSS in response to an output of the NOR gate 1415.

Figure 6:
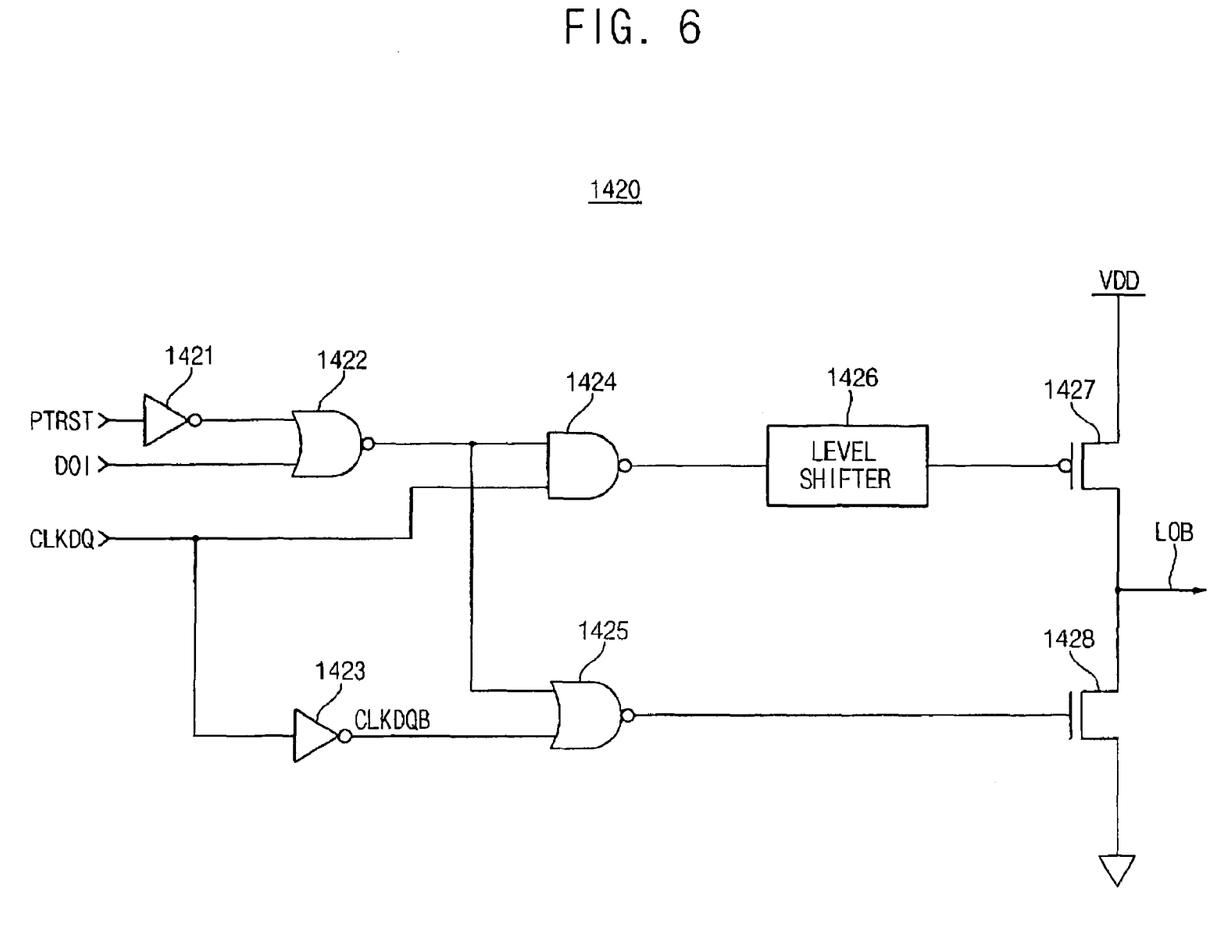
FIG. 6 is a circuit diagram illustrating a second output driving unit according to another example embodiment of the present invention.

FIG. 6 is a circuit diagram illustrating the second output driving unit 1420 of the output buffer 1400 of FIG. 4 according to another example embodiment of the present invention. In the example embodiment of FIG. 6, the second output driving unit 1420 may include inverters 1421 and 1423, NOR gates 1422 and 1425, a NAND gate 1424, a level shifter 1426, a pull-up transistor 1427 and a pull-down transistor 1428.

In the example embodiment of FIG. 6, the inverter 1421 may invert the output buffer enabling signal PTRST and the inverter 1423 may invert the output clock signal CLKDQ. The NOR gate 1422 may execute a NOR operation on an output signal of the inverter 1421 and the output data DOI. The NAND gate 1424 may execute a NAND operation on an output signal of the NOR gate 1422 and the output clock signal CLKDQ. The NOR gate 1425 may execute a NOR operation on an output signal of the inverter 1423 and the output of the NOR gate 1422. The level shifter 1427 may shift or adjust a voltage level of an output signal of the NAND gate 1424. The pull-up transistor 1428 may electrically connect the second output line LOB to the power supply voltage VDD in response to an output of the level shifter 1426, and the pull-down transistor 1418 may electrically connect the second output line LOB to the ground voltage VSS in response to an output of the NOR gate 1425.

Figure 7:
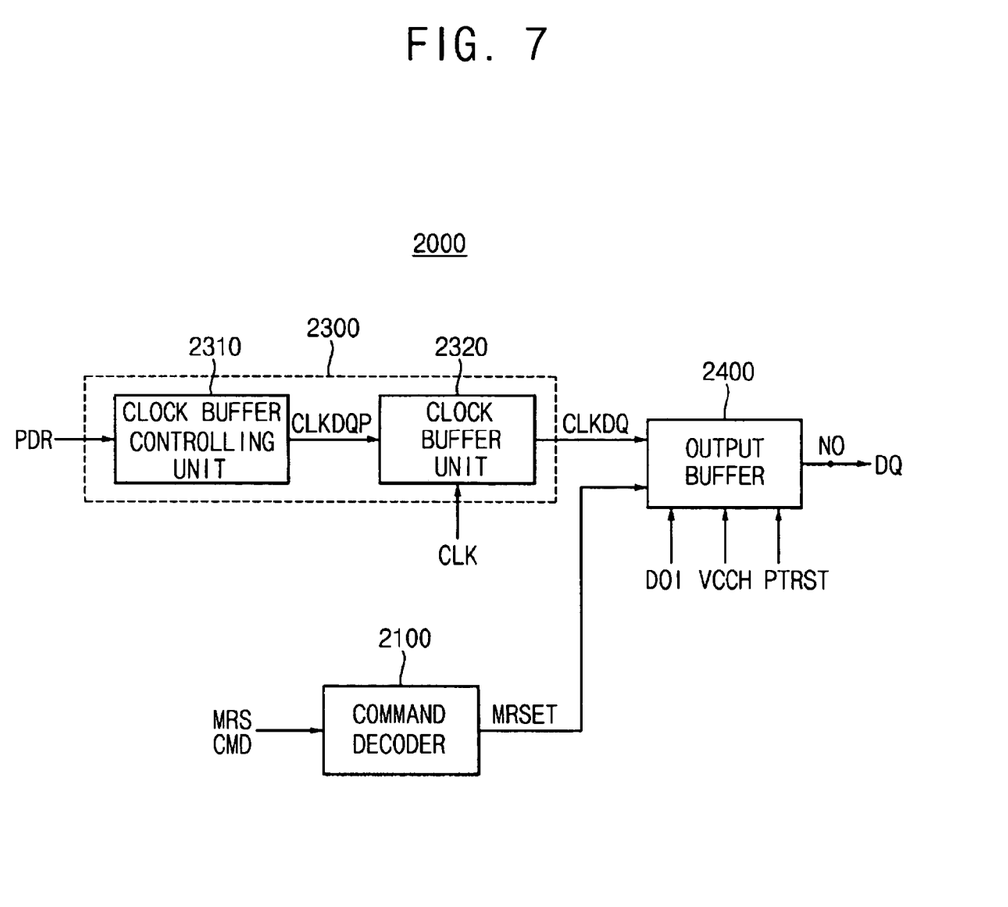
FIG. 7 is a block diagram illustrating another output circuit according to another example embodiment of the present invention.

FIG. 7 is a block diagram illustrating an output circuit 2000 according to another example embodiment of the present invention. In the example embodiment of FIG. 7, the output circuit 2000 may include a clock buffer 2300 and an output buffer 2400.

In the example embodiment of FIG. 7, the clock buffer 2300 may generate the output clock signal CLKDQ in response to the read signal PDR and the clock signal CLK. The output buffer 2400 may buffer the output data DOI, which may be transferred to the output node NO, in response to the output clock signal CLKDQ, the MRS signal MRSET and the output buffer enabling signal PTRST. The output buffer 2400 may also initialize the output node NO in response to the power-up signal VCCH and the MRS signal MRSET.

In the example embodiment of FIG. 7, the output buffer 2000 may further include a command decoder 2100 to generate the MRS signal MRSET in response to the MRS command MRS CMD. In an example, the MRS command MRS CMD may include one or more of a chip select signal (CS), a row address strobe signal (RAS), a column address strobe signal (CAS) and/or a write enable signal (WE), etc.

In the example embodiment of FIG. 7, the clock buffer 2300 may include a clock buffer control circuit 2310 and a clock buffer unit 2320. The clock buffer control circuit 2310 may generate the clock buffer enabling signal CLKDQP in response to the read signal PDR. The clock buffer unit 2320 may generate the output clock signal CLKDQ in response to the clock buffer enabling signal CLKDQP and the clock signal CLK.

In the example embodiment of FIG. 7, unlike the output circuit 1000 of FIG. 1, the output circuit 2000 may not include an initialization signal generator. Rather, the MRS signal MRSET may be directly applied to the output buffer 2400 and the output node NO may be initialized in response to the output clock signal CLKDQ (e.g., during an abnormal condition such as a soft reset).

Figure 8:
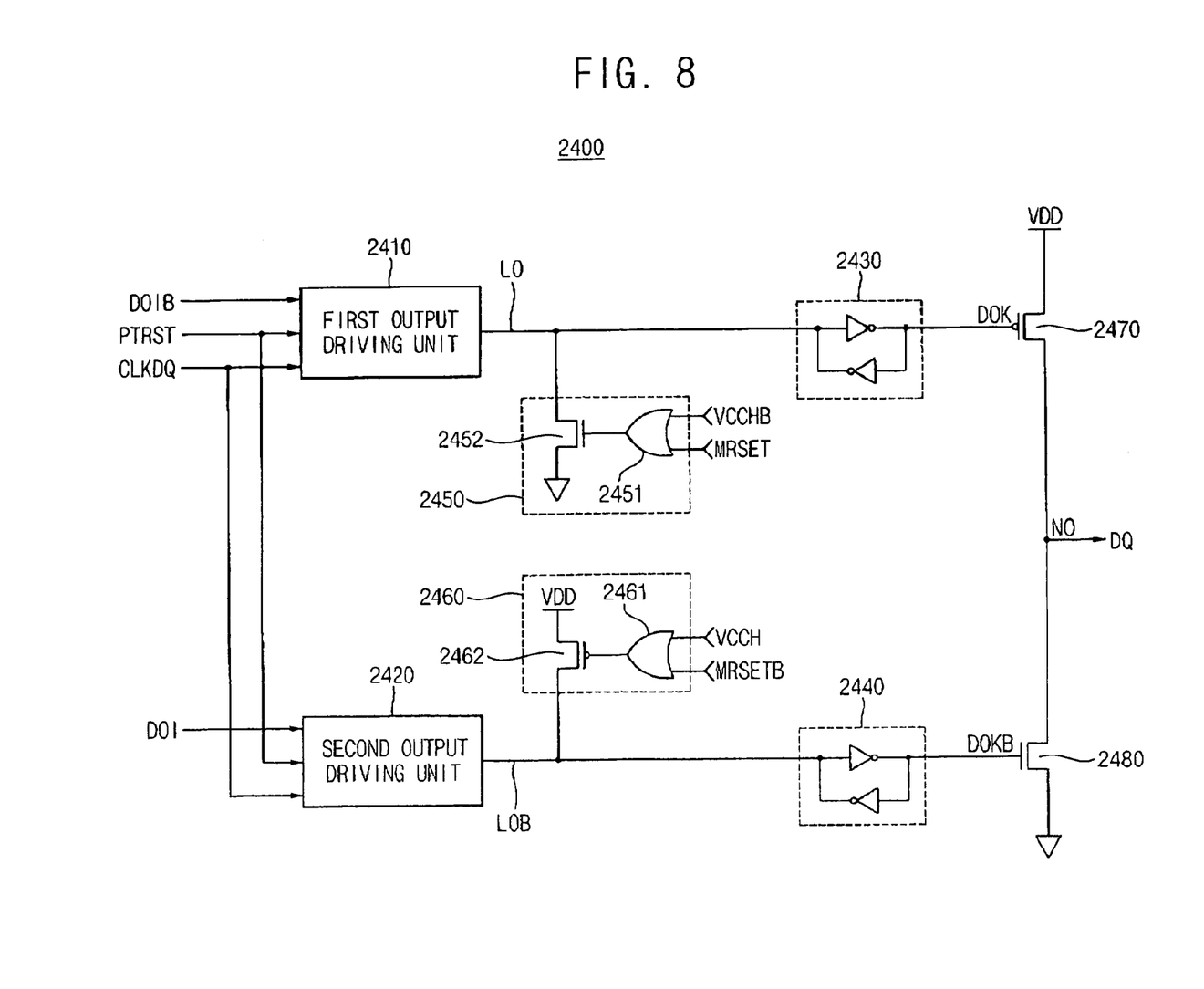
FIG. 8 is a circuit diagram illustrating an output buffer according to another example embodiment of the present invention.

FIG. 8 is a circuit diagram illustrating the output buffer 2400 included in the output circuit 2000 of FIG. 8 according to another example embodiment of the present invention. In the example embodiment of FIG. 8, the output buffer 2400 may include a first output driving unit 2410, a second output driving unit 2420, a first latch 2430, a second latch 2440, a pull-up transistor 2470 and a pull-down transistor 2480.

In the example embodiment of FIG. 8, the first output driving unit 2410 may output the inverted output data DOIB to the first output line LO in response to the output buffer enabling signal PTRST and the output clock signal CLKDQ. The second output driving unit 2420 may output the output data DOI to the second output line LOB in response to the output buffer enabling signal PTRST and the output clock signal CLKDQ. The first latch 2430 may latch a first signal received on the first output line LO, and the second latch 2440 may latch a second signal received on the second output line LOB.

In the example embodiment of FIG. 8, the pull-up transistor 2470 may electrically connect the output node NO to the power supply voltage VDD in response to an output signal DOK of the first latch 2430. The pull-down transistor 2480 may electrically connect the output node NO to the ground voltage VSS in response to an output signal DOKB of the second latch 2440.

In the example embodiment of FIG. 8, the output buffer 2400 may include a first reset circuit 2450 and a second reset circuit 2460. The first reset circuit 2450 may electrically connect the first output line LO to the ground voltage VSS in response to the MRS signal MRSET and the inverted power-up signal VCCHB. The second reset circuit 2460 may electrically connect the second output line LOB to the power supply voltage VDD in response to the inverted MRS signal MRSETB and the power-up signal VCCH.

In an example, referring to FIG. 8, the first reset circuit 2450 may include an OR gate 2451 and an NMOS transistor 2452. The OR gate 2451 may execute a disjunction (OR) operation on the MRS signal MRSET and the inverted power-up signal VCCHB. The NMOS transistor 2452 may be connected between the first output line LO and the ground voltage VSS, and may be activated by an output of the OR gate 2451.

In another example, referring to FIG. 8, the second reset circuit 2460 may include an OR gate 2461 and an NMOS transistor 2462. The OR gate 2461 may execute an OR operation of an inverted MRS signal MRSETB and the power-up signal VCCH. The NMOS transistor 2462 may be connected between the power supply voltage VDD and the second output line LOB, and may be activated by an output of the OR gate 2452.

Example operation of the output buffer 2400 of FIG. 8 will now be described in greater detail.

In example operation of the output buffer 2400 of FIG. 8, the output buffer 2400 may transfer the output node NO with the output data DOI as the final output data DQ. During a power-up operation, the first reset circuit 2450 may transition the first output line LO to the second logic level (e.g., a lower logic level or logic "0") and the second reset circuit 2460 may transition the output line LOB to the first logic level (e.g., a higher logic level or logic "1"). A gate of the pull-up transistor 2470 may receive a signal set to the first logic level (e.g., the output signal DOK), and a gate of the pull-down transistor 2480 may receive a signal set to the second logic level (e.g., the inverted output signal DOKB). Thus, both the pull-up transistor 2470 and the pull-down transistor 2480 may be turned off and the output node NO may transition to the higher impedance state.

In example operation of the output buffer 2400 of FIG. 8, if a semiconductor memory device including the output circuit 2000 of FIG. 7, which further includes the output buffer 2400, executes a write operation after a read operation, the first and second reset circuits 2450 and 2460 (e.g., in the output buffer 2400) may transition the output node NO to the higher impedance state in response to the MRS signal MRSET and the inverted MRS signal MRSETB.

Figure 9:
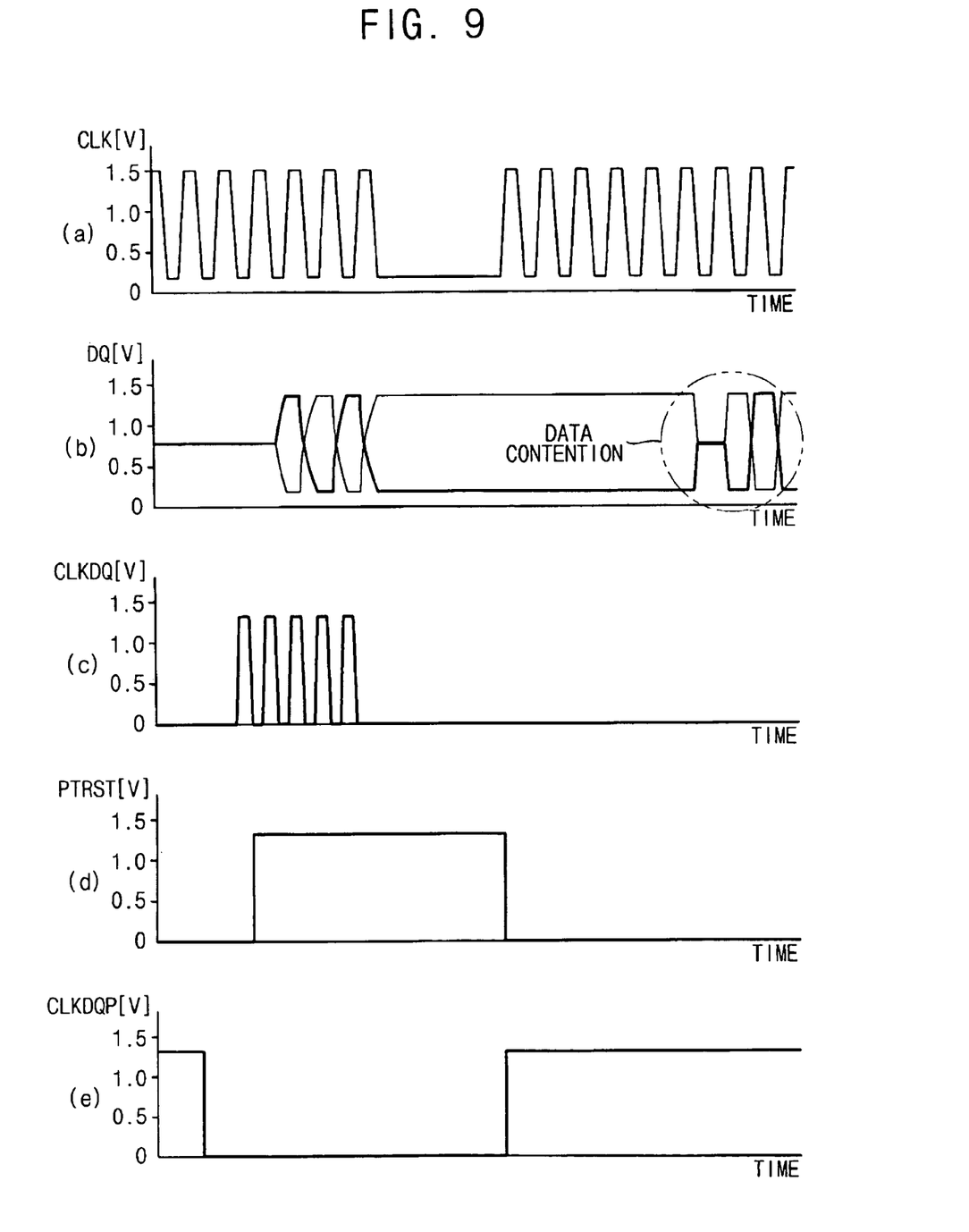
FIG. 9 illustrates a set of simulation results for a semiconductor memory device including a conventional output circuit.

FIG. 9 illustrates a set of simulation results for a semiconductor memory device including a conventional output circuit. In particular, FIG. 9 illustrates simulation results of a write operation after a read operation. As shown in FIG. 9, a data contention in the output data DQ may occur when an abnormal condition (e.g., a soft reset) in the clock signal occurs and is followed by a write operation executed after a read operation.

Figure 10:
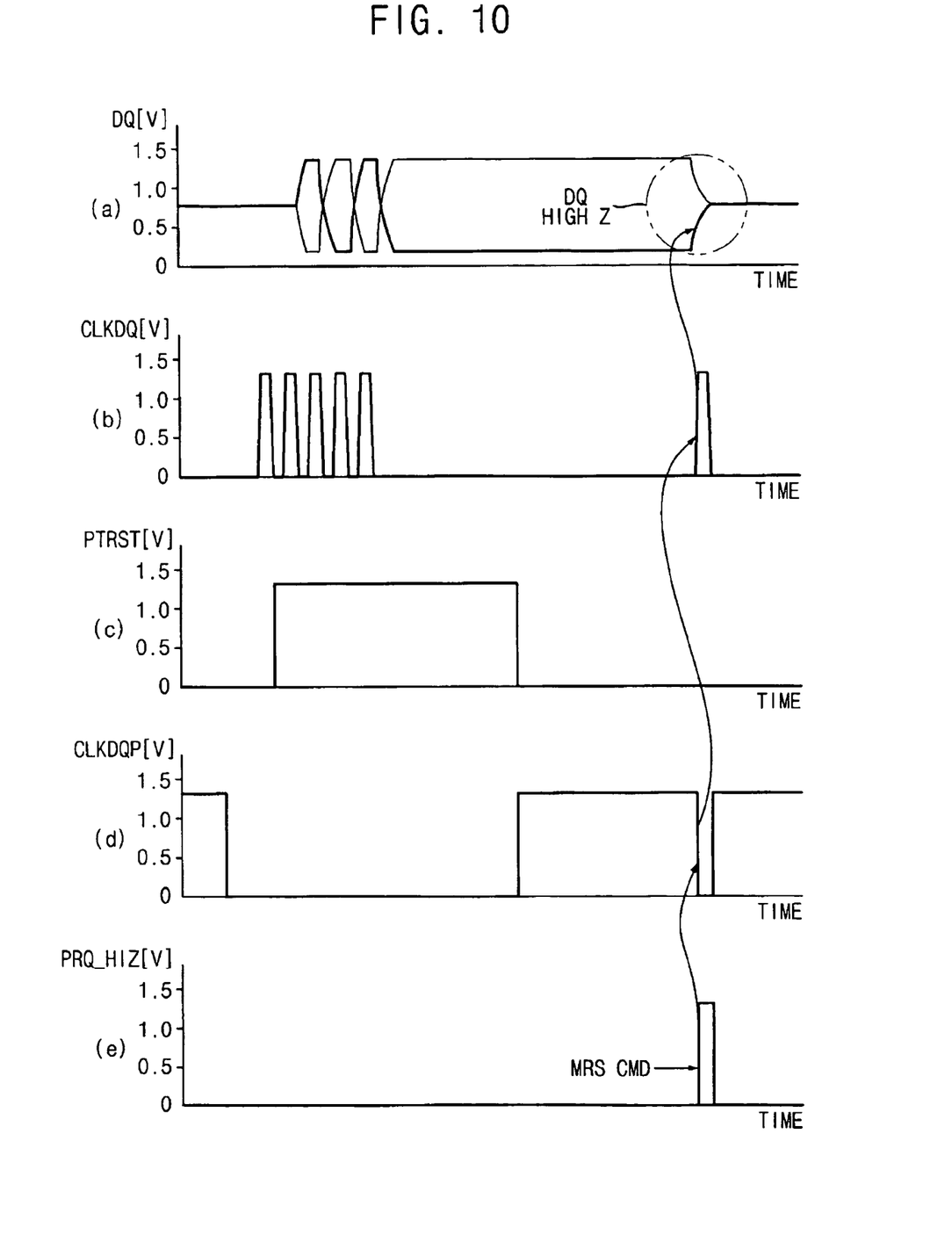
FIG. 10 illustrates a set of simulation results for a semiconductor memory device including an output circuit according to an example embodiment of the present invention.

FIG. 10 illustrates a set of simulation results for a semiconductor memory device including an output circuit (e.g., the output circuit 1000 of FIG. 1, the output circuit 2000 of FIG. 7, etc.) according to another example embodiment of the present invention.

In the example embodiment of FIG. 10, a graph corresponding to the output data DQ (i.e., graph "a") may illustrate that when an abnormal condition in the clock signal (e.g., from graph "b") occurs and then a write operation is executed after a read operation, the output node may be initialized by transitioning to the higher impedance state DQ HIGH Z. The graph of the output data DQ, or graph "a", may also show that the initialization signal PRQ_HIZ (e.g., see graph e) may be generated in response to an MRS signal generated based on the MRS command MRS CMD. The clock buffer enabling signal CLKDQP (e.g., see graph "e") may be activated in response to the initialization signal PRQ_HIZ, and the output clock signal CLKDQ may be generated in response to the clock buffer enabling signal CLKDQP. The output data DQ may be initialized in response to the output clock signal CLKDQ by transitioning the output node NO to the higher impedance state DQ HIGH Z.

In another example embodiment of the present invention, an output circuit of a semiconductor memory device may be initialized or reset in response to an abnormal condition, such as a soft reset. Accordingly, "garbage data" or data contention in data output by the output circuit may be reduced.

Example embodiments of the present invention being thus described, it will be obvious that the same may be varied in many ways. For example, while the above-described example embodiments refer to the first logic level as being a higher logic level or logic "1" and the second logic level as being a lower logic level or logic "0", it is understood that other example embodiments may be configured such that the first logic level is lower than the second logic level.

Such variations are not to be regarded as departure from the spirit and scope of example embodiments of the present invention, and all such modifications as would be obvious to one skilled in the art are intended to be included within the scope of the following claims.

What is claimed is:

1. An output circuit, comprising:
   a clock buffer configured to generate an output clock signal;
   an output buffer configured to buffer output data and to transfer the buffered output data to an output node, the output buffer being configured to receive the output clock signal, the output buffer being configured to initialize the output node in response to a triggering signal, initializing the output node including transitioning the output node to a higher impedance state; and
   an initialization signal generator configured to generate an initialization signal in response to an internal clock signal and a mode register set signal.

2. The output circuit of claim 1, wherein the output buffer buffers the buffered output data in response to the output clock signal, the mode register set signal and an output buffer enabling signal.

3. The output circuit of claim 2, wherein the triggering signal is the mode register set signal.

4. The output circuit of claim 2, wherein the clock buffer is configured to generate the output clock signal in response to a read signal and a clock signal.

5. The output circuit of claim 2, wherein the output buffer includes:
   a first output driving unit configured to output an inverted output data to a first output line in response to the output buffer enabling signal and the output clock signal;
   a second output driving unit configured to output an output data of a semiconductor memory device to a second output line in response to the output buffer enabling signal and the output clock signal;
   a pull-up transistor for electrically connecting the output node to a first voltage supply in response to a signal on the first output line; and
   a pull-down transistor for electrically connecting the output node to a second voltage supply in response to a signal on the second output line.

6. The output circuit of claim 5, wherein the first voltage supply is higher than the second voltage supply.

7. The output circuit of claim 5, wherein the output buffer further includes:
   a first latch for latching the signal on the first output line and providing the signal on the first output line to a control node of the pull-up transistor; and
   a second latch for latching the signal on the second output line and providing the signal on the second output line to a control node of the pull-down transistor.

8. The output circuit of claim 5, wherein the output buffer further includes:
   a first reset circuit for electrically connecting the first output line to the second voltage supply in response to an inverted power-up signal; and
   a second reset circuit for electrically connecting the second output line to the first voltage supply in response to a power-up signal.

9. The output circuit of claim 5, wherein the output buffer comprises:
   a first reset circuit for electrically connecting the first output line to the second voltage supply in response to the mode register set signal and an inverted power-up signal; and
   a second reset circuit for electrically connecting the second output line to the first voltage supply in response to an inverted mode register set signal and a power-up signal.

10. The output circuit of claim 9, wherein the first reset circuit includes:
    an OR gate for executing a logical OR operation on the mode register set signal and the inverted power-up signal; and
    a transistor connected between the first output line and the second voltage supply, and activated in response to an output of the OR gate.

11. The output circuit of claim 9, wherein the second reset circuit includes:
    an OR gate for executing a logical OR operation on the inverted mode register set signal and the power-up signal; and
    a transistor connected between the second output line and the first voltage supply, and activated in response to an output of the OR gate.

12. The output circuit of claim 1,
    wherein the output buffer is further configured to initialize the output node in response to a power-up signal during a power-up operation.

13. The output circuit of claim 1, wherein the clock buffer is configured to generate the output clock signal in response to a read signal, the initialization signal and a clock signal, and wherein the output buffer is configured to buffer the buffered output data in response to an output buffer enabling signal, and the triggering signal is the output clock signal.

14. The output circuit of claim 1, further comprising:
a command decoder configured to generate the mode register set signal in response to a mode register set command.

15. The output circuit of claim 14, wherein the mode register set command includes at least one of a chip select signal, a row address strobe signal, a column address strobe signal, and a write enabling signal.

16. The output circuit of claim 1, wherein the clock buffer includes:
a clock buffer controlling unit configured to generate a clock buffer enabling signal in response to a read signal and the initialization signal; and
a clock buffer unit configured to generate the output clock signal in response to the clock buffer enabling signal and a clock signal.

17. The output circuit of claim 1, wherein the initialization signal is generated in response to the mode register set signal, the initialization signal being a pulse having a given pulse width.

18. The output circuit of claim 17, wherein the given pulse width is longer than a period of the internal clock signal.

19. The output circuit of claim 17, wherein and the given pulse width is shorter than two periods of the internal clock signal.

20. The output circuit of claim 1, wherein the initialization signal generator includes:
a transfer gate for transferring a first signal having a first logic level to a first node in response to the mode register set signal;
a latch for latching the first signal at the first node to provide the latched signal to a second node;
a delay circuit for delaying the latched signal at the second node for a delay time to generate a second signal in response to the internal clock signal;
an auto-pulse generator configured to generate a reset control signal having a given pulse width in response to the second signal; and
a reset circuit configured to reset the first node In response to the reset control signal,
wherein the initialization signal is generated based on the latched signal provided to the second node.

21. The output circuit of claim 20, wherein the reset circuit includes a transistor that is activated by the reset control signal.

22. The output circuit of claim 20, wherein the first signal is inverted from a ground voltage.

23. The output circuit of claim 20, wherein the delay circuit includes:
a first delay unit configured to delay the latched signal provided to the second node for a first delay time to generate a third signal;
a second delay unit configured to delay the third signal for a second delay time to generate the second signal.

24. The output circuit of claim 23, wherein the first delay time is approximately one period of the internal clock signal.

25. A method of outputting data with the output circuit of claim 1.

26. A method of outputting data from an output circuit, comprising:
generating an output clock signal, the output clock signal being received by an output buffer;
buffering output data in response to an output buffer enabling signal;
transferring the buffered output data to an output node;
initializing the output node of the output buffer in response to a triggering signal, initializing the output node including transitioning the output node to a higher impedance state; and
further, generating an initialization signal In response to an internal clock signal and a mode register set signal, wherein
the output clock signal is generated in response to a read signal, the initialization signal and a clock signal, and
the output clock signal is the triggering signal.

27. The method of claim 26, wherein generating an initialization signal includes:
transferring a first signal having a first logic level to a first node in response to the mode register set signal;
latching the first signal at the first node and transferring the latched signal to a second node;
delaying the latched signal at the second node for a given delay time to generate a second signal in response to the internal clock signal;
generating a reset control signal having a given pulse width in response to the second signal;
resetting the first node in response to the reset control signal; and
generating the initialization signal based on the latched signal at the second node.

28. A method of outputting data from an output circuit, comprising:
generating an output clock signal, the output clock signal being received by an output buffer;
buffering output data in response to an output buffer enabling signal;
transferring the buffered output data to an output node; and
initializing the output node of the output buffer In response to a triggering signal, initializing the output node including transitioning the output node to a higher impedance state, wherein
the output clock signal is generated in response to a read signal and a clock signal,
the buffering the output data is further based on the output clock signal and a mode register set signal, and
the mode register set signal is the triggering signal.

29. An output circuit, comprising:
a clock buffer configured to generate an output clock signal; and
an output buffer configured to buffer output data and to transfer the buffered output data to an output node, the output buffer being configured to receive the output clock signal, the output buffer being configured to initialize the output node in response to a triggering signal, initializing the output node including transitioning the output node to a higher impedance state,
wherein the output buffer buffers the buffered output data in response to the output clock signal, a mode register set signal and an output buffer enabling signal, and
wherein the output buffer includes:
a first output driving unit configured to output an inverted output data to a first output line in response to the output buffer enabling signal and the output clock signal;
a second output driving unit configured to output an output data of a semiconductor memory device to a second output line in response to the output buffer enabling signal and the output clock signal.

* * * * *